United States Patent [19]
Seitz et al.

[11] Patent Number: 6,016,253
[45] Date of Patent: Jan. 18, 2000

[54] ELECTRONIC MODULE

[75] Inventors: Georg Seitz, Kasing; Joachim Lach, Neuburg; Ernst-Ludwig Klein, Lenting; Roland Wolfschläger, Roth; Ekkehard Sachs, Spaichingen, all of Germany

[73] Assignees: Temic Telefunken Microeletronics GmbH, Heilbronn; Marquardt GmbH, Rietheim-Weilheim, both of Germany

[21] Appl. No.: 09/154,822

[22] Filed: Sep. 17, 1998

[30] Foreign Application Priority Data

Sep. 18, 1997 [DE] Germany .......................... 197 41 047

[51] Int. Cl.[7] .................................................. H05K 01/14
[52] U.S. Cl. .......................... 361/735; 361/748; 361/776; 361/749; 361/784; 361/792; 174/117 F; 174/117 FF; 174/250; 174/254; 439/61; 439/67; 439/77; 439/493; 29/829; 29/830
[58] Field of Search .................................... 361/735, 757, 361/748, 767, 771, 776, 784, 792, 749; 174/117 F, 117 FF, 250, 254, 256, 261, 268; 439/61, 67, 77, 493; 29/829, 830

[56] References Cited

U.S. PATENT DOCUMENTS

| | | | |
|---|---|---|---|
| 4,268,956 | 5/1981 | Parks et al. | 29/869 |
| 4,873,764 | 10/1989 | Grimm | 29/830 |
| 5,093,985 | 3/1992 | Houldsworth et al. | 29/830 |
| 5,224,023 | 6/1993 | Smith et al. | 361/784 |
| 5,265,322 | 11/1993 | Fisher et al. | 29/848 |
| 5,274,195 | 12/1993 | Murphy et al. | 174/117 F |
| 5,406,027 | 4/1995 | Matsumoto et al. | 174/52.2 |
| 5,428,190 | 6/1995 | Stopperan | 174/261 |
| 5,717,556 | 2/1998 | Yanagida | 361/803 |
| 5,742,484 | 4/1998 | Gillette et al. | 361/789 |
| 5,789,815 | 8/1998 | Tessier et al. | 257/723 |

FOREIGN PATENT DOCUMENTS

| | | |
|---|---|---|
| 0386279A1 | 9/1990 | European Pat. Off. . |
| 0632683A2 | 1/1995 | European Pat. Off. . |
| 7717962 | 6/1977 | Germany . |
| 166991 | 3/1989 | Japan . |
| 590749 | 4/1993 | Japan . |
| 6112622 | 4/1994 | Japan . |

OTHER PUBLICATIONS

Handbook of Flexible Circuits, Ken Gilleo, published by Van Nostrand Holland, New York, 1992, pp. 98–99.

*Primary Examiner*—Leo P. Picard
*Assistant Examiner*—David Foster
*Attorney, Agent, or Firm*—Venable; George H. Spencer; Ashley J. Wells

[57] ABSTRACT

According to known methods, several circuit board pieces in a three-dimensional arrangement of an electronic module are connected together electrically by the film connectors and arranged around an operator control or actuator element in the three-dimensional form. The assembly of such modules is, however, very costly because the circuit boards must all be fastened mechanically. By using film connectors with greater stiffness, circuit board pieces can be held over these directly without additional mechanical securing devices and the three-dimensional circuit board arrangement can be secured by appropriate securing devices in the three-dimensional form. A preferred application is for electronic modules with operator control and/or actuator elements where the space available is very limited, in particular for modules fitted in motor vehicles.

5 Claims, 4 Drawing Sheets

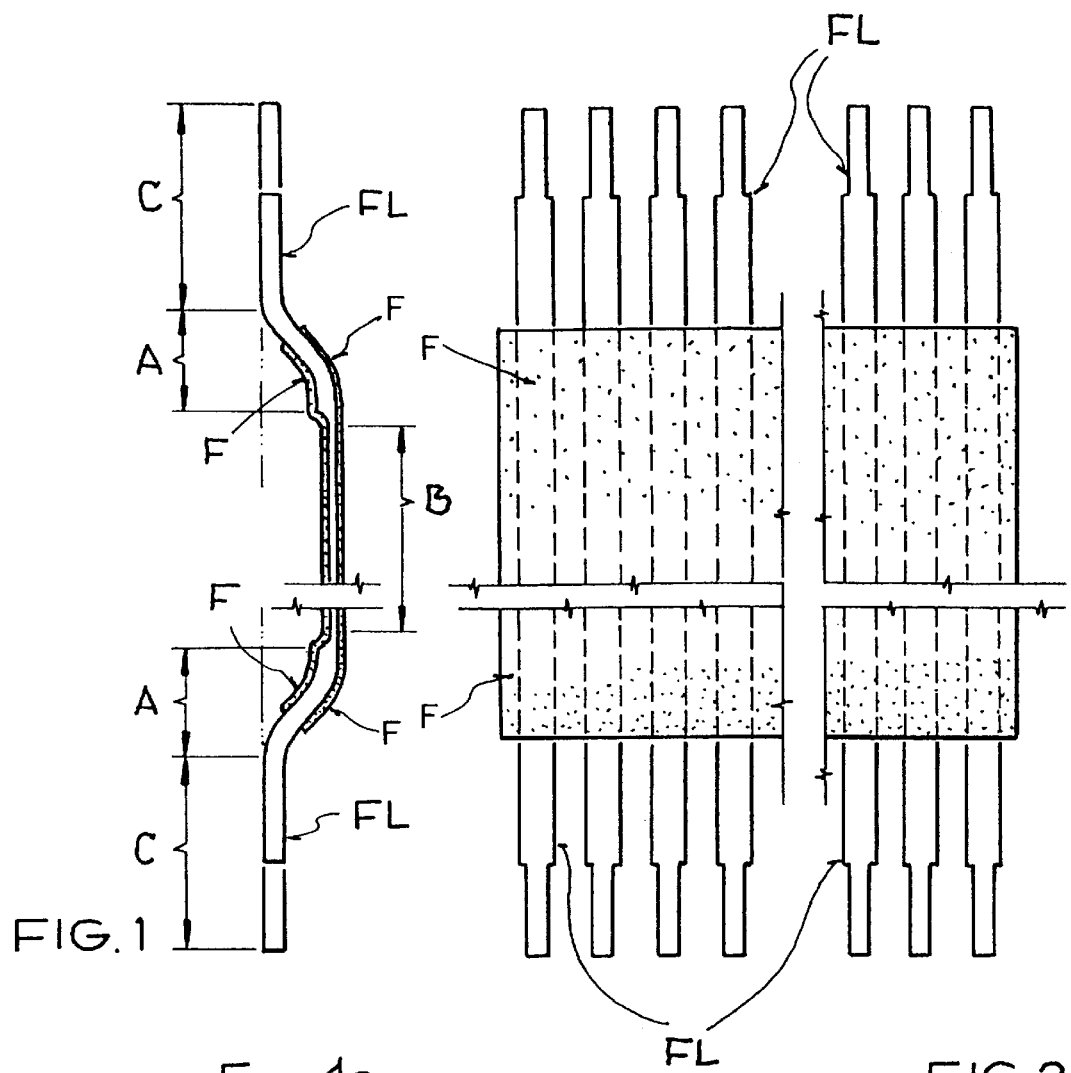
FIG. 1
FIG. 2
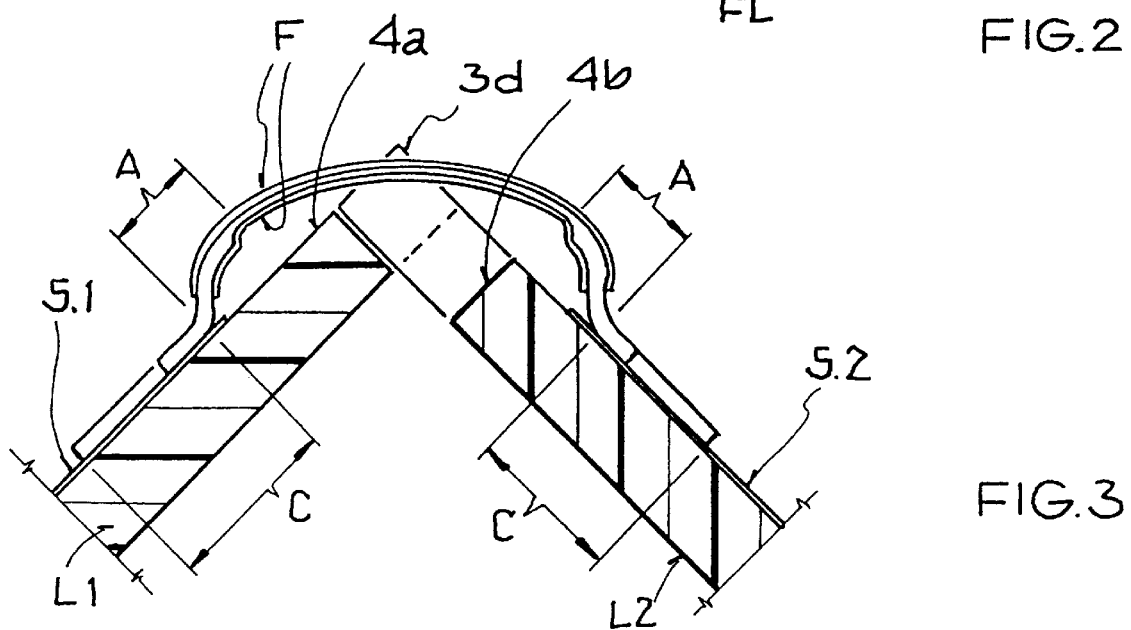
FIG. 3

ELECTRONIC MODULE

BACKGROUND OF THE INVENTION

The invention relates to an electronic module in accordance with the preamble of Patent claim 1.

From U.S. Pat. No. 5,093,985, a manufacturing process is already known for small electrical devices and modules where a three-dimensional circuit board arrangement is used with flexible film connectors.

Flexible film Connectors make it possible here to electrically connect several individual circuit board pieces and to arrange them to suit the space available Flexible film connectors are already known as being state of the art. Thus, it is known that so-called ribbon cables, i.e. several copper strand conductors adjacent to each other in a plastic enclosure, can be used for the flexible connection of circuit boards, a method commonly applied for connecting PC cards, for example. Flexible connector cables for circuit boards are also known from U.S. Pat. No. 4,268,956, as well as a fixture for connecting electrical conductors printed on films in accordance with the utility model application DE-GM 7717962 Although film connectors of this kind are very flexible, they cannot ensure a definite positioning of the circuit board pieces. For this reason, the invention in the publication U.S. Pat. No. 5,093,985 also has additional mechanical holders designed as snap-in elements between the various circuit board pieces. Similar flexible connectors for circuit board pieces are also known from the publication JP 5-90749 or from JP 6-112622. These too call for an additional means of holding the circuit board pieces. Moreover, U.S. Pat. No. 5,274,195 describes a flexible circuit board connector and in particular a method for its manufacture in which the flat conductive paths are etched. The circuit board connector thus becomes more elastic and is additionally covered by an elastic plastic layer. Flexible conductive path films are also described in EP 03 86 279 A1, EP 06 32 683 A2 and JP 1-66991, where in the case of EP 03 86 279 this flexible conductive path film is also partially stabilized by a plastic extrusion and arranged three-dimensionally. Components are still attached to the flexible conductive path film, however, compared with which circuit boards are considerably easier to handle.

SUMMARY OF THE INVENTION

The invention provides an electronic module in which the number of mechanical holders is reduced and where the attachment of components and assembly of the three-dimensional circuit boards is simplified.

The concept of the invention is to distribute the electronic components over several circuit board pieces, to connect these with film connectors and arrange them around the operator control and/or actuator element. In order to be able to dispense with additional mechanical holders, the film connectors themselves must be capable of withstanding mechanical loads. At the same time, the film connectors must be provided with a certain stiffness, in spite of their elasticity that is required in order to form the three-dimensional circuit board arrangement. Particular preference is given here to film connectors with a multiple number of flat conductor tracks made of copper with a thickness of 75 to 150 $\mu$m and reinforced by polyimide films.

For closing and securing the three-dimensional form of the circuit board arrangement, means are provided, preferably a mechanically stable solder connection, that at the same time act as electrical connection.

In order to fabricate the electronic module, it is particularly advantageous to initially arrange the circuit board pieces in one plane, i.e. flat, to attach the electronic components and film connectors in this state and only then to bend the circuit board arrangement along the film connectors to create the three-dimensional form. This makes it possible to attach components to the circuit board arrangement in a particularly simple manner, e.g. by means of a SMD soldering process. The electronic module can here be adapted very well to the external three-dimensional form of the operator control and/or actuator element, and at the same time not only requires less space but is also less costly than known solutions.

---

Brief description of the drawings:

FIG. 1 Cross section of the circuit board connector in the straight state
FIG. 2 Top view on the circuit board connector
FIG. 3 Cross section of the circuit board connector in assembly with circuit board pieces at 90° to each other
FIG. 4 Three-dimensional arrangement of several circuit board pieces connected with circuit board connectors
FIG. 5 The arrangement of the circuit board pieces in one plane ready for attaching components
FIG. 6 Detail view of additional mechanical supporting points on the circuit board pieces
FIG. 7 Insertion of the operator control and/or actuator element in the circuit board arrangement
FIG. 8 Electronic module, before closing the housing
FIG. 9 View on the circuit board piece L1 held without support over the circuit board connector of the electronic module, including the front housing half with the electrical connection zone

---

DESCRIPTION OF THE PREFERRED EMBODIMENTS

FIG. 1 shows the cross-section of a flexible circuit board connector. The film connector is divided mirror-symmetrically into a bending zone B, a gap, and the zone of the terminals C. In this embodiment example, the terminals C are designed as SMD feet. In the unbent state, the gap A is S-shaped and this is necessary in order to separate the bending zone from the circuit boards. In the bending zone B, it can be clearly seen that the flat conductor track FL is thinner. Above and below the bending zone and over at least parts of the right and left gap A there is a flexible film F which is attached to the flat conductor tracks by means of an adhesive.

FIG. 2 shows a top view on the film connector, where the quantity, the width and the gap between the flat conductor tracks FL can be adapted to suit the individual case. In this embodiment example, a particularly advantageous further development of the invention can be seen, namely that the SMD contact feet have a section of diminished thickness in order to improve the formation of the solder meniscus and hence the x-ray testing capability. The electrical properties of the flat conductor track are scarcely affected by this because in a transitional zone of the terminal zone C to the gap A the full cross-section of the flat conductor track FL already comes into contact with the solder material.

FIG. 3 shows a cross-section through the circuit board connector which on the one hand connects together the circuit board pieces L1 and L2 electrically and on the other hand acts as a mechanical holder for the circuit board pieces. The film connector is attached to the flexible film F by adhesive between the gaps A, thus relieving the load on the bending zone. The equilibrium of forces between the bending and adhesive forces is determinant for the detailed design of the invention. As can be seen in FIG. 3, the bending zone B of the flexible circuit board connector adapts to the 90° angle between the circuit board pieces L1 and L2.

In order to obtain as symmetrical a loading as possible of the bending zone B, it is advisable to arrange the contact zones of the circuit boards with their conductive paths or metallized layers 5.1 and 5.2 with a gap that is also symmetrical. The terminal zones C are each aligned in accordance with the 90° angle of the circuit boards L1 and L2.

Figure 4:
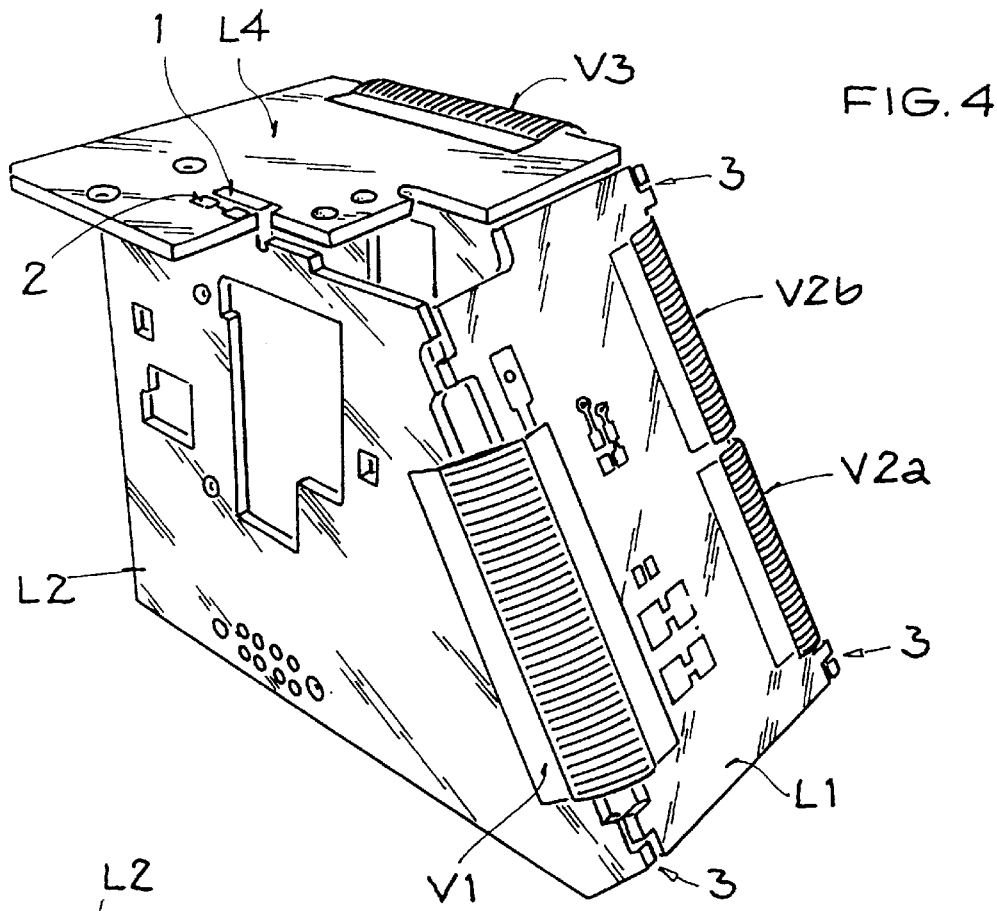

FIG. 4 shows a three-dimensional arrangement of several circuit board pieces L1 to L4, where the circuit board L1 in this embodiment example is held only by the two circuit board connectors V1 and V2 (split up into V2a and V2b), free of other mechanical fastening means. Circuit boards can not only be connected by circuit board connectors but also by solder connections as it is used between the soldering pins 1 and the soldering opening 2 to mechanically secure the circuit board arrangement in its three-dimensional form. In order to reduce assembly time, however, it is advisable to use the least and largest possible soldering points, e.g. the chassis ground.

Figure 5:
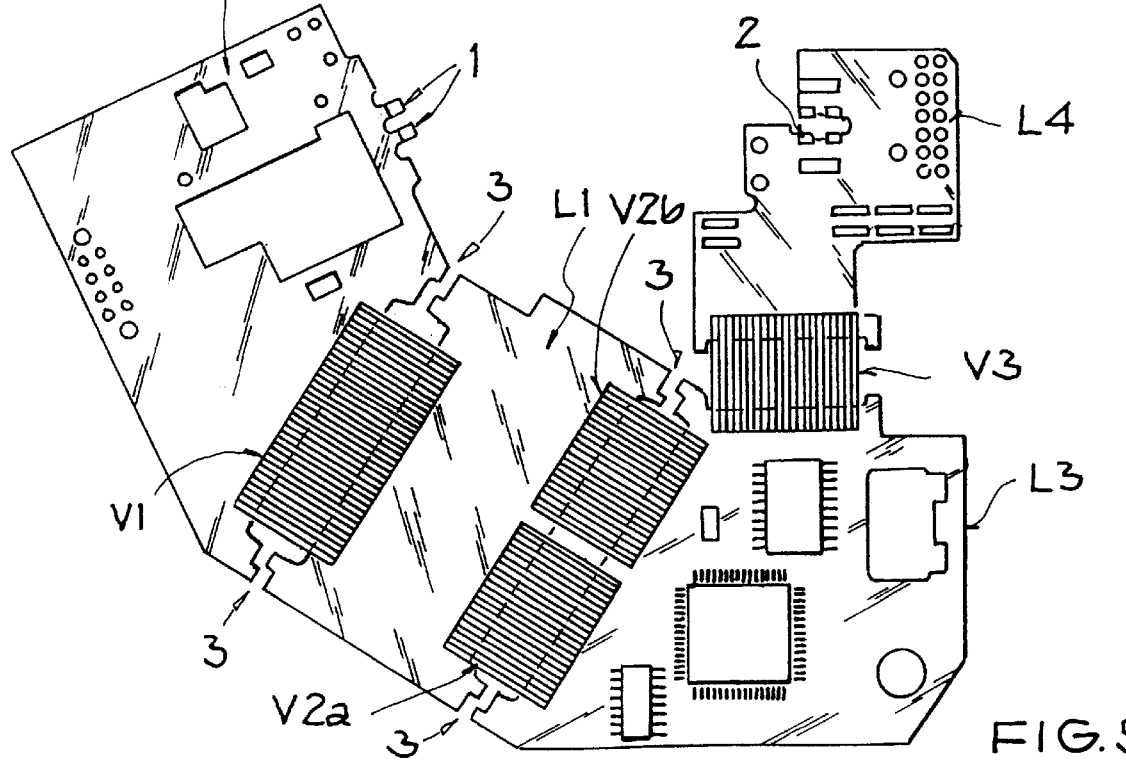

FIG. 5 shows the three-dimensional circuit board arrangement of FIG. 4 in the component attachment state, i.e. at the time of attaching components to the various circuit board pieces. As can be seen here, it is possible to attach components and the film connectors V1 to V3 to all circuit board Pieces L1 to L4 at one and the same time and in one plane. On conclusion of the process of attaching components, the various circuit board pieces L1 to L4 are folded together to create the three-dimensional arrangement shown in FIG. 4. While doing so, the soldering pin 1 snaps into the soldering opening 2 and is soldered so that the three-dimensional circuit board arrangement as shown in FIG. 4 can now also be built into other parts. It should be emphasized once again that the circuit board piece L1 is held only by the circuit board connectors; when attaching components to the circuit board LP1, the weight distribution of the components must be considered.

Figure 6:
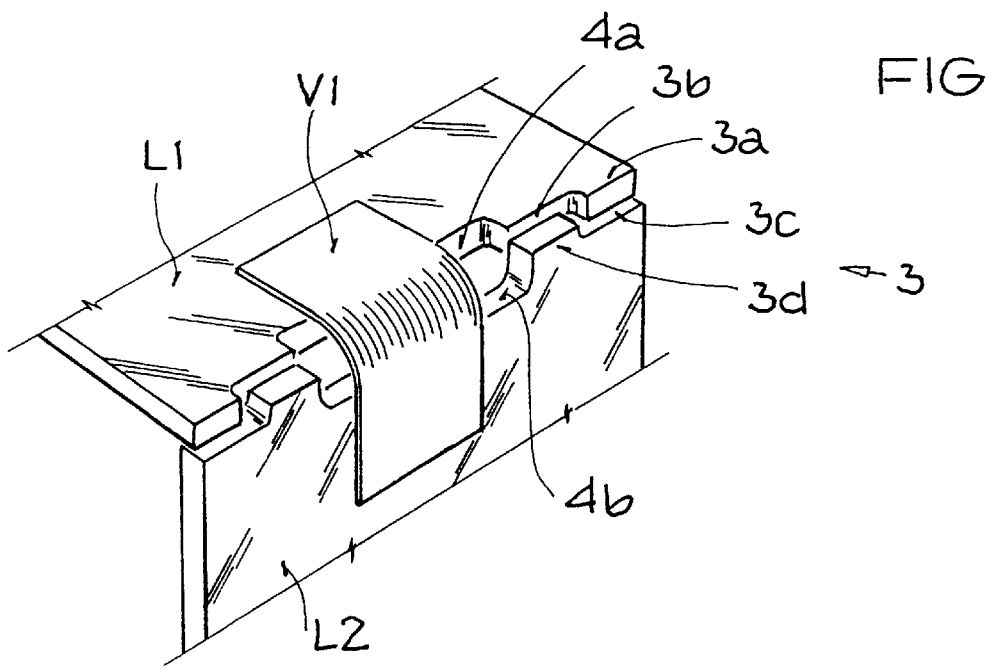

FIGS. 4 and 5 also show at this stage the additional mechanical support points 3 that can be seen enlarged in FIG. 6. Whereas a considerable gap could still be seen between the supporting points 3 in the planar arrangement of the circuit board arrangements in FIG. 5, in the bent state shown in FIG. 6 it can be seen how the mechanical supporting points engage inside each other, thereby protecting the circuit boards against excessive loading. The mechanical supporting points comprise a first projection 3a on the first circuit board piece L1, to which a recess 3c on the second circuit board piece L2 is assigned, and a second projection 3d now on the second circuit board piece L2 and an associated recess 3b on the first circuit board piece L1.

It is also conceivable that these mechanical supporting points be metallized and that soldering connections then be provided over these points after bending into the three-dimensional arrangement, for example at the chassis ground of the circuit boards.

Figure 7:
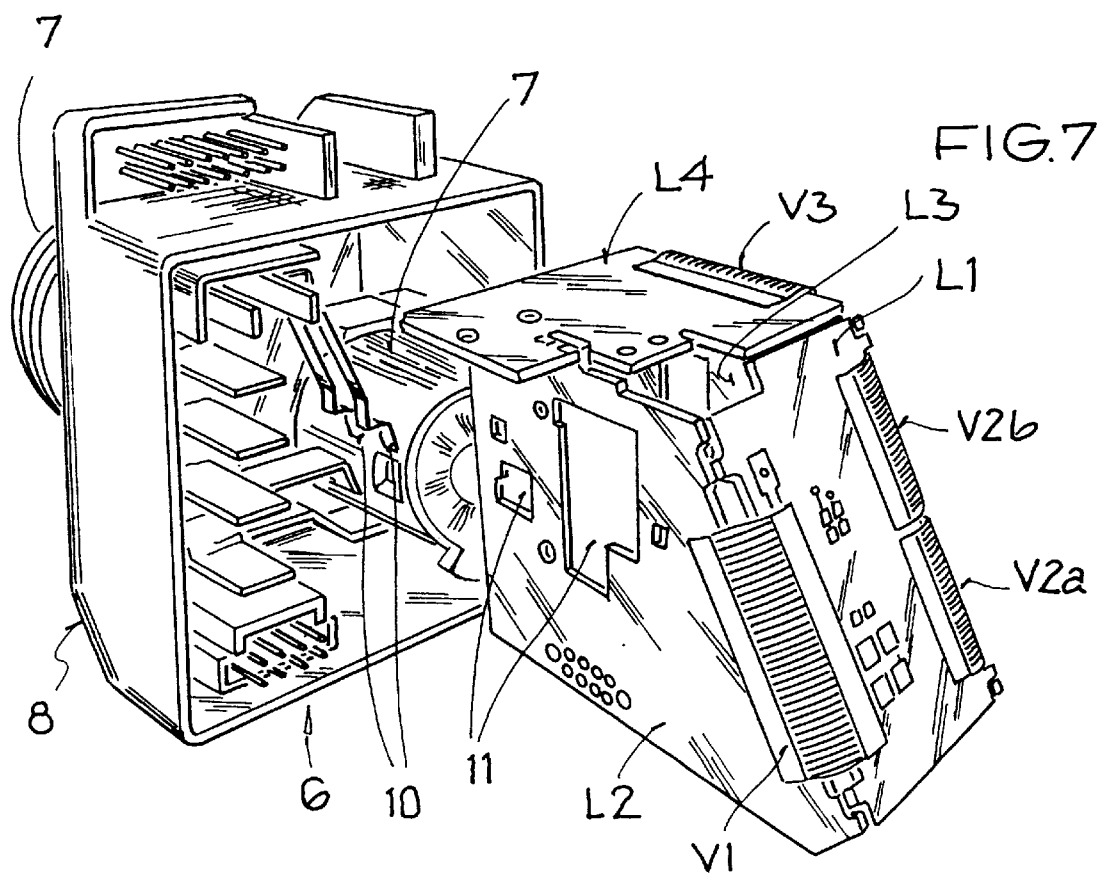

In FIG. 7, the insertion of the operator control and/or actuator element 7 in the three-dimensional circuit board arrangement (cf. FIG. 4) is visualized. The operator control and/or actuator element 7 in this embodiment example is an electronic ignition lock for motor vehicles; the concept of the invention is not, however, limited to this. The operator control and/or actuator element 7 is arranged in the front housing half 8 which has an electrical terminal zone 6 and also connecting means 10 for the mechanical and/or electrical connection of the three-dimensional circuit board arrangement to the operator control and/or actuator element 7 and the front housing half 8. On the circuit board piece L2, the openings 11 are also indicated, into which the connecting means 10 engage and snap-in and establish the electrical contact.

Figure 8:
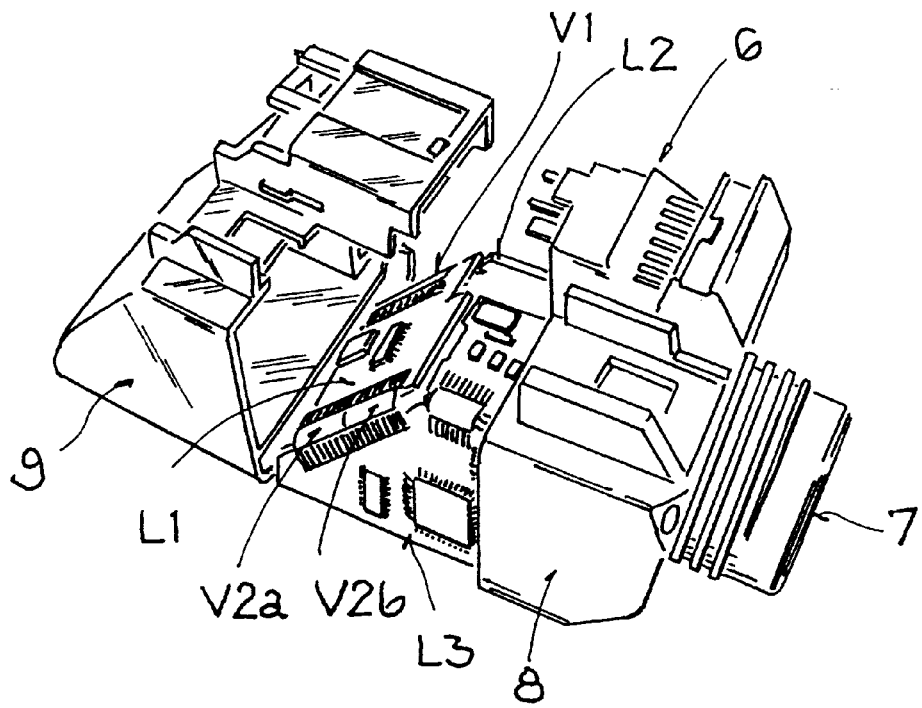

FIG. 8 shows the electronic module before closing the housing which comprises a front housing half 8 with an electrical terminal zone 6 and a rear housing part 9 that has openings to accommodate the terminal zone 6. On the front housing part, it is also possible to see the cover for the operator control and/or actuator element 7 which is situated within the space formed by the circuit board pieces.

Figure 9:
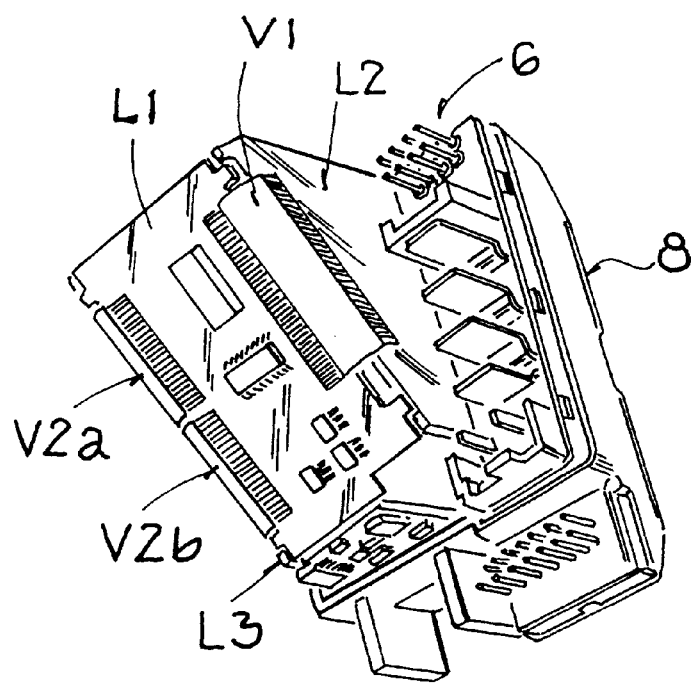

FIG. 9 shows the electronic module once again in a rotated view as compared with FIG. 8. In this view, it is once again possible to see clearly the circuit board piece L1 held by the circuit board connectors V1 and V2a, V2b free of other fastening means in the electronic module, as well as the front housing half 8 with the electrical terminal zone 6.

What is claimed is:

1. Electronic module comprising an operator control and/or actuator element and a three-dimensional circuit board arrangement consisting of several circuit board pieces with electronic components attached, where
    a) the circuit board pieces are connected together electrically by means of film connectors,
    b) the film connectors in the zones between the circuit board pieces have an elasticity which is such that the circuit board pieces are bent into a freely supported stable arrangement adapted to the three-dimensional form of the operator control and/or actuator element in a manner whereby the operator control and/or actuator element is partially enclosed by the circuit board pieces,
    c) provision is made for connection points to connect the circuit board arrangement with the operator control and/or actuator element
    d) and also means for closing and securing the circuit board arrangement in the three-dimensional form.

2. Electronic module in accordance with Patent claim 1, wherein the film connectors have a multiple number of flat conductor tracks arranged in parallel to each other and made of copper with a thickness in the bending zone of between 75 and 150 μm and with a polyimide film of approximately 25 μm attached by adhesion to the upper and/or underside.

3. Electronic module in accordance with Patent claim 1, wherein provision is made for the means of closing and securing the circuit board arrangement between two circuit board pieces and comprises a soldering opening in one circuit board piece and a part which can be soldered in it on an adjacent circuit board piece.

4. Electronic module in accordance with Patent claim 1, wherein the soldering opening and the part which can be soldered in it at the same time also establish an electrical connection between the circuit board pieces.

5. Method for fabricating the electronic module in accordance with Patent claim 1, wherein
    a) the circuit board pieces are arranged in one plane, in which state the film connectors and electrical components are attached, and
    b) the circuit board arrangement is subsequently folded at the film connectors around the operator control and/or actuator element, secured and connected to the operator control and/or actuator element.

* * * * *